US011809791B2

(12) United States Patent
Kohlhoff (10) Patent No.: US 11,809,791 B2
(45) Date of Patent: Nov. 7, 2023

(54) LEVERAGING 3D MODEL DATA FOR INSPECTION OPERATIONS

(71) Applicant: SAP SE, Walldrof (DE)

(72) Inventor: Stephan Kohlhoff, Darmstadt (DE)

(73) Assignee: SAP SE, Walldorf (DE)

( * ) Notice: Subject to any disclaimer, the term of this patent is extended or adjusted under 35 U.S.C. 154(b) by 255 days.

(21) Appl. No.: 16/572,338

(22) Filed: Sep. 16, 2019

(65) Prior Publication Data

US 2021/0081507 A1 Mar. 18, 2021

(51) Int. Cl.
*G06G 7/48* (2006.01)
*G06F 30/23* (2020.01)
*G06F 30/17* (2020.01)
*G06T 7/00* (2017.01)
*G06T 19/20* (2011.01)

(52) U.S. Cl.
CPC .............. *G06F 30/23* (2020.01); *G06F 30/17* (2020.01); *G06T 7/001* (2013.01); *G06T 19/20* (2013.01); *G06T 2219/2008* (2013.01)

(58) Field of Classification Search
CPC ........ G06Q 10/20; G06Q 50/04; G06T 19/20; G06T 2219/2008; G06T 7/001; Y02P 90/30; G06F 30/23; G06F 30/17
See application file for complete search history.

(56) References Cited

U.S. PATENT DOCUMENTS 8,416,236 B1 * 4/2013 Hickman ................ G06T 19/20
345/419
2016/0334778 A1 * 11/2016 Cope .................... G05B 19/401

OTHER PUBLICATIONS

Yang, Jiaming, et al. "Research on converting CAD model to MCNP model based on STEP file." 2013 International Joint Conference on Awareness Science and Technology & Ubi-Media Computing (iCAST 2013 & UMEDIA 2013). IEEE, 2013.*

* cited by examiner

*Primary Examiner* — Rehana Perveen
*Assistant Examiner* — Nithya J. Moll
(74) *Attorney, Agent, or Firm* — Fountainhead Law Group P.C.

(57) ABSTRACT

Some embodiments provide a non-transitory machine-readable medium that stores a program. The program retrieves an assembly and inspection plan for a product. The assembly and inspection plan includes a three-dimensional (3D) model of the product to be assembled. The program further creates an inspection task for an inspection operation in the assembly and inspection plan for the product. The program also associates the 3D model with the inspection task for the inspection operation.

20 Claims, 8 Drawing Sheets

| Operation ID | Description | Operation Type ID | Station ID |
|---|---|---|---|
| 0010 | Assembly | PP01 | 1010 |
| 0020 | Inspection | QM01 | 1013 |
| 0030 | Assembly | PP01 | 1014 |

FIG. 3B

| Operation ID | Task ID | Task Instructions | 3D Model View | 3D Model Part | Inspection Point |
|---|---|---|---|---|---|
| 0020 | 0010 | Check gear | VIEW0001 | P001304 | POINT0001 |
| 0020 | 0020 | Check fitting | VIEW0002 | P007166 | POINT0002 |
| 0020 | 0020 | Check fitting | VIEW0002 | P007166 | POINT0003 |

LEVERAGING 3D MODEL DATA FOR INSPECTION OPERATIONS

BACKGROUND

In parts manufacturing product and manufacturing information can be used to derive inspection plans. Dimensions and tolerances specified in a 3D model are typically stored as product and manufacturing information in the 3D CAD model. This data can be used to derive inspection plans used in parts manufacturing to ensure that quality criteria are being met. In an assembly process, product and manufacturing information are rarely used. Common quantitative quality criteria are torque values controlling how well parts are attached to each other. Often times a visual, qualitative inspection is required during the assembly process. Today, the visual assets, which are being used for visual inspection planning, are paper-based (e.g., printouts of photographs, screenshots, scans, etc.). As a result, such visual assets can be out dated or incorrect as products are revised and updated.

SUMMARY

In some embodiments, a non-transitory machine-readable medium stores a program executable by at least one processing unit of a device. The program retrieves an assembly and inspection plan for a product. The assembly and inspection plan includes a three-dimensional (3D) model of the product to be assembled. The program further creates an inspection task for an inspection operation in the assembly and inspection plan for the product. The program also associates the 3D model with the inspection task for the inspection operation.

In some embodiments, associating the 3D model with the inspection task for the inspection operation may include receiving a definition of a view of the 3D model, receiving a specification of a part in the 3D model and receiving a definition of a reference to a region of the part in the 3D model. The assembly and inspection plan may include a set of assembly operations. Each assembly operation in the set of assembly operations may include instructions for assembling a set of parts in the 3D model. The inspection task may include instructions for inspecting a part in the set of parts in the 3D model.

In some embodiments, the inspection task may be a first inspection task. The program may further create a second inspection task for the inspection operation in the assembly and inspection plan for the product and associate the 3D model with the second inspection task for the inspection operation. The inspection task may be a first inspection task. The program may further create a second inspection task for a second inspection operation in the assembly and inspection plan for the product and associate the 3D model with the second inspection task for the second inspection operation. The program may further receive a request to edit the assembly and inspection plan for the product. Retrieving the assembly and inspection plan for the product may be performed in response to receiving the request.

In some embodiments, a method retrieves an assembly and inspection plan for a product. The assembly and inspection plan includes a three-dimensional (3D) model of the product to be assembled. The method further creates an inspection task for an inspection operation in the assembly and inspection plan for the product. The method also associates the 3D model with the inspection task for the inspection operation.

In some embodiments, the method may further receive a definition of a view of the 3D model, receive a specification of a part in the 3D model, and receive a definition of a reference to a region of the part in the 3D model. The assembly and inspection plan may include a set of assembly operations. Each assembly operation in the set of assembly operations may include instructions for assembling a set of parts in the 3D model. The inspection task may include instructions for inspecting a part in the set of parts in the 3D model.

In some embodiments, the inspection task may be a first inspection task. The method may further create a second inspection task for the inspection operation in the assembly and inspection plan for the product and associate the 3D model with the second inspection task for the inspection operation. The inspection task may be a first inspection task. The method may further create a second inspection task for a second inspection operation in the assembly and inspection plan for the product and associate the 3D model with the second inspection task for the second inspection operation. The method may further receive a request to edit the assembly and inspection plan for the product. Retrieving the assembly and inspection plan for the product may be performed in response to receiving the request.

In some embodiments, a system includes a set of processing units and a non-transitory machine-readable medium that stores instructions. The instructions cause at least one processing unit to retrieve an assembly and inspection plan for a product. The assembly and inspection plan includes a three-dimensional (3D) model of the product to be assembled. The instructions further cause the at least one processing unit to create an inspection task for an inspection operation in the assembly and inspection plan for the product. The instructions also cause the at least one processing unit to associate the 3D model with the inspection task for the inspection operation.

In some embodiments, the instructions may further cause the at least one processing unit to receive a definition of a view of the 3D model, receive a specification of a part in the 3D model, and receive a definition of a reference to a region of the part in the 3D model. The assembly and inspection plan may include a set of assembly operations. Each assembly operation in the set of assembly operations may include instructions for assembling a set of parts in the 3D model. The inspection task may include instructions for inspecting a part in the set of parts in the 3D model.

In some embodiments, the inspection task may be a first inspection task. The instructions further cause the at least one processing unit to create a second inspection task for the inspection operation in the assembly and inspection plan for the product and associate the 3D model with the second inspection task for the inspection operation. The inspection task may be a first inspection task. The instructions further cause the at least one processing unit to create a second inspection task for a second inspection operation in the assembly and inspection plan for the product and associate the 3D model with the second inspection task for the second inspection operation.

The following detailed description and accompanying drawings provide a better understanding of the nature and advantages of the present invention.

DETAILED DESCRIPTION

In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Described herein are techniques for leveraging 3D model data for inspection operations. In some embodiments, a system includes a CAD system, client devices, and a computing system. A user of the CAD system may create a 3D model of a product. The user can transmit the 3D model to the computing system. Upon receiving the 3D model, computing system transforms the 3D model into a space-optimized format. Next, a user of a client device may associate data in the 3D model of the product with an assembly and inspection plan for the product. The assembly and inspection plan for a product can include a 3D model of the product, a list of parts in the 3D model (e.g., a bill of materials (BOM)), a set of assembly operations, and a set of inspection operations. In some cases, the user of the client device may create inspection tasks for an inspection operation in the assembly and inspection plan. In other cases, inspection tasks may already be created for inspection operations in the assembly and inspection plan. For an inspection task, the user of the client device can specify a part of the 3D model to be inspected. Next, the user of the client device may define for the inspection task a view of the 3D model that shows the part of the 3D model. In addition, the user of the client device can define for the inspection task a reference to a region of the part in the 3D model. Associating data in the 3D model with the assembly and inspection plan allows a user of the assembly and inspection plan (e.g., an employee on the shop floor of an assembly plant) to easily locate and view parts in the 3D model that are specified to be inspected.

Figure 1:
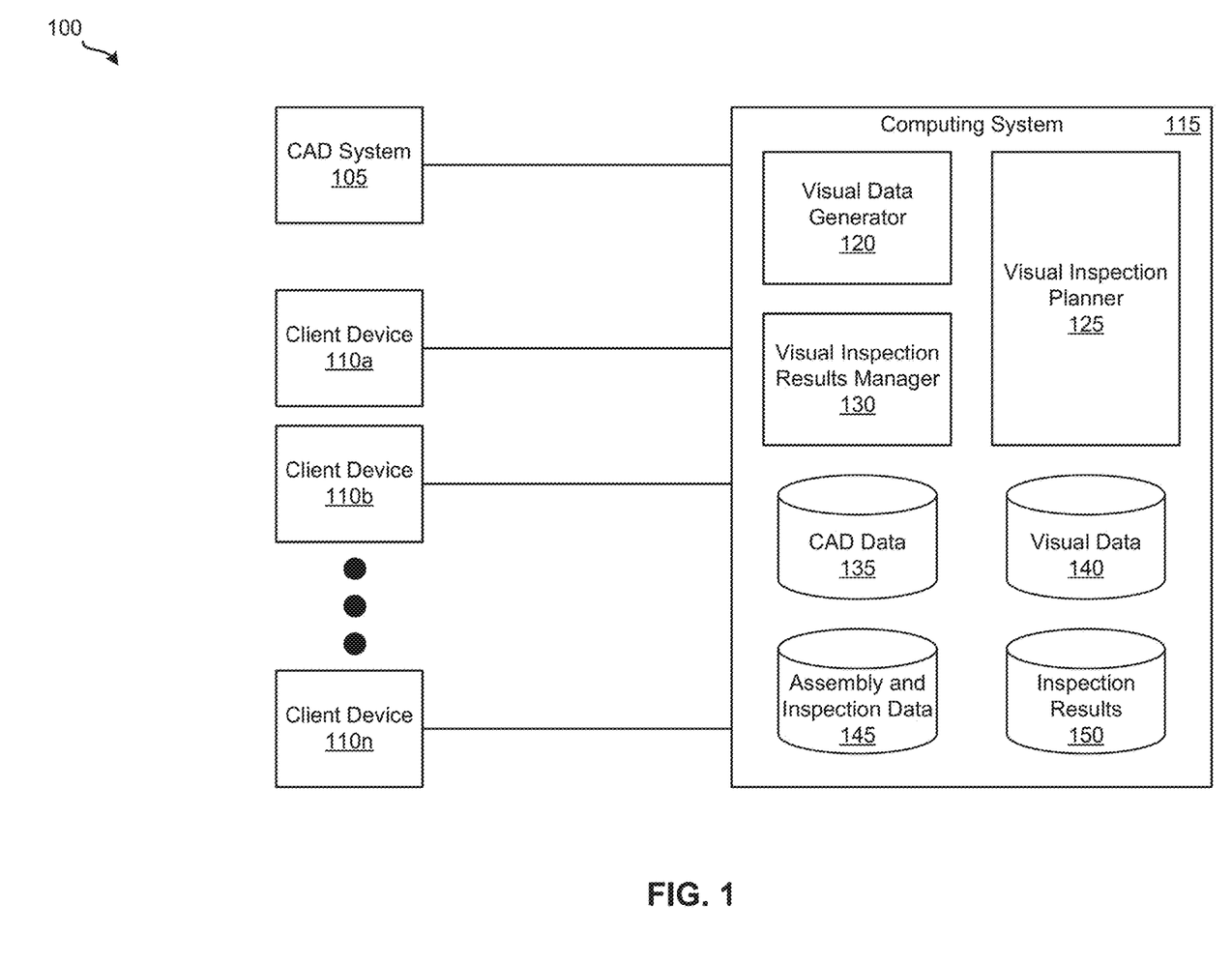
FIG. 1 illustrates a system for creating assembly and inspection plans based on 3D model data according to some embodiments.

FIG. 1 illustrates a system 100 for creating assembly and inspection plans based on 3D model data according to some embodiments. As shown, system 100 includes CAD system 105, client devices 110a-110n, and computing system 115. CAD system 105 may include hardware and software tools for designing products in two-dimensional (2D) space and/ or three-dimensional (3D) space. For example, a user of CAD system 105 can create and design 3D models of products. The 3D model of a product can include any number of parts, subparts, assemblies, and/or subassemblies. When creating a 3D model of a product, the user of CAD system 105 may provide metadata about the components in the 3D model, such as part numbers, materials, dimensions, tolerances, etc. After creating the 3D model, the user of CAD system 105 can send the 3D model to computing system 115. In some embodiments, CAD system 105 may be implemented using one or more computing devices.

Each of the client devices 110a-110n may be configured to communicate and interact with computing system 115. For instance, a user of a client device 110 may access computing system 115 to associate data in a 3D model of a product with an assembly and inspection plan for the product. As mentioned above, an assembly and inspection plan for a product can include a 3D model of the product, a list of parts in the 3D model, a set of assembly operations, and a set of inspection operations. In some instances, inspection tasks for inspection operations have already been created in the assembly and inspection plan. In other instances, the user of the client device 110 creates inspection tasks for inspection operations in the assembly and inspection plan. The user of the client device 110 can define, for each inspection task, a part of the 3D model to be inspected, a set of inspection instructions to perform on the part, a view of the 3D model that shows the part of the 3D model, and a reference to a region of the part in the 3D model. The part of the 3D model can be defined in terms of a part number of the part. The view of the 3D model may be defined in terms a position of a virtual camera in a 3D space of the 3D model (e.g., a set of x, y, and z coordinates in the 3D space of the 3D model) and a focal length of the virtual camera used to view the 3D model. The reference to the region of the part in the 3D model can be defined in terms of a surface of the part or a point (e.g., a set of x, y, and z coordinates in the 3D space of the 3D model) on a surface of the part. In some cases, the reference to the region of the part in the 3D model includes an annotation to the region of the part (e.g., an arrow, a highlight, etc.).

A user of a client device 110 can also access computing system 115 to retrieve an assembly and inspection plan for a product that has been associated with data in a 3D model of the product. The user of the client device 110 may be responsible for performing one or more inspection operations during assembly of the product. To do so, the user of the client device 110 may access the assembly and inspection plan and view data in the 3D model associated with the relevant inspection operations in the assembly and inspection plan. For example, when the user of the client device 110 is performing an inspection task of an inspection operation, the user can access the corresponding inspection task in the assembly and inspection plan to see a view of the 3D model of the product that shows the part to be inspected, a set of instructions to perform on the part, and a specific region of the part to be inspected. Once the user of the client device 110 completes the inspection task, the user can send computing system 115 results of the inspection.

As illustrated in FIG. 1, computing system 115 includes visual data generator 120, visual inspection planner 125, visual inspection results manager 130, and storages 135-150. CAD data storages 135 is configured to store 3D models created by and received from CAD system 105. Visual data storage 140 may store 3D models that have been transformed into a space-optimized format. Assembly and inspection data storage 145 is configured to store assembly and inspection plans. Inspection results storage 150 can store results of inspections performed on products. In some embodiments, storages 135-150 are implemented in a single physical storage while, in other embodiments, storages 135-150 may be implemented across several physical storages. While FIG. 1 shows storages 135-150 as part of computing system 115, one of ordinary skill in the art will appreciate that CAD data storage 135, visual data storage 140, assembly and inspection data storage 145, and/or inspection results storage 150 may be external to computing system 115 in some embodiments.

Visual data generator 120 is responsible for transforming 3D models into different formats. For example, when computing system 115 receives a 3D model of a product from CAD system 105, visual data generator transforms the format of the 3D model into a space-optimized format. In some embodiments, a space-optimized format of a 3D model includes the same metadata and attributes as the 3D model created by CAD system 105 except the size of the file of the space-optimized format of the 3D model is smaller (e.g., ten times smaller, twenty times smaller, fifty times smaller, etc.). In some embodiments, visual data generator 120 transforms the format of the 3D model into a space-optimized format by removing CAD specific information that may be relevant for CAD system 105 but not relevant for representing the 3D geometry by itself and reducing the precision of the 3D geometry using a tessellation technique. After transforming the format of the 3D model into the space-optimized format, visual data generator 120 stores the original 3D model in CAD data storage 135 and stores the space-optimized format of the 3D model in visual data storage 140.

Visual inspection planner 125 is responsible for providing tools for creating and editing assembly and inspection plans. Visual inspection planner 125 provides these tools to users of client devices 110 via a graphical user interface (GUI). For instance, when a user of a client device 110 sends visual inspection planner 125 a request, via the GUI, to create an assembly and inspection plan for a product, visual inspection planner 125 accesses visual data 125 and retrieves the 3D model of the product and a list of the parts in the 3D model. As described above, an assembly and inspection plan for a product can include a 3D model of the product, a list of parts in the 3D model, a set of assembly operations, and a set of inspection operations. An assembly operation may specify several parts in a 3D model of a product and instructions for how to assemble the several parts. An inspection operation can include one or more inspection tasks. Each inspection task may define a view of the 3D model of the product that shows the part to be inspected, a set of instructions to perform on the part, and a specific region of the part to be inspected. The user of the client device 110 can create such assembly operations and inspection operations for the assembly and inspection plan through the GUI. After a user of a client device 110 is done creating an assembly and inspection plan, visual inspection planner 125 stores it in assembly and inspection data storage 145. When a user of a client device 110 wants to edit an assembly and inspection plan, visual inspection planner 125 retrieves it from assembly and inspection data storage 145 and allows the user to edit it. In some embodiments, after a user of a client device 110 is done creating or editing an assembly and inspection plan, visual inspection planner 125 may generate a self-contained file based on the assembly and inspection plan and save it in assembly and inspection data storage 145 for later access by another user of a client device 110. The self-contained file is configured to play in a 3D viewer executing on a computing device without network access. This way, an employee on the shop floor of an assembly plant may still reference the assembly and inspection plan without connection to computing system 115.

Visual inspection results manager 130 manages results of inspection performed on products. For instance, visual inspection results manager 130 may provide a user of a client device 110 a GUI through which the user may send results of inspections performed on a product according to inspection operations specified in an assembly and inspection plan for the product. When visual inspection results manager 130 receives results of an inspection, visual inspection results manager 130 stores the results in inspections results storage 150.

An example operation will now be described by reference to FIGS. 2-4. Specifically, the example operation is a workflow for associating data in a 3D model of a product with inspection operations in an assembly and inspection plan. The example operation starts by a user of client device 110b accessing visual inspection planner 125 and sending it a request to edit an assembly and inspection plan. In response to the request, visual inspection planner 125 retrieves the assembly and inspection plan from assembly and inspection data storage 145 and sends it to client device 110b.

Figure 2:
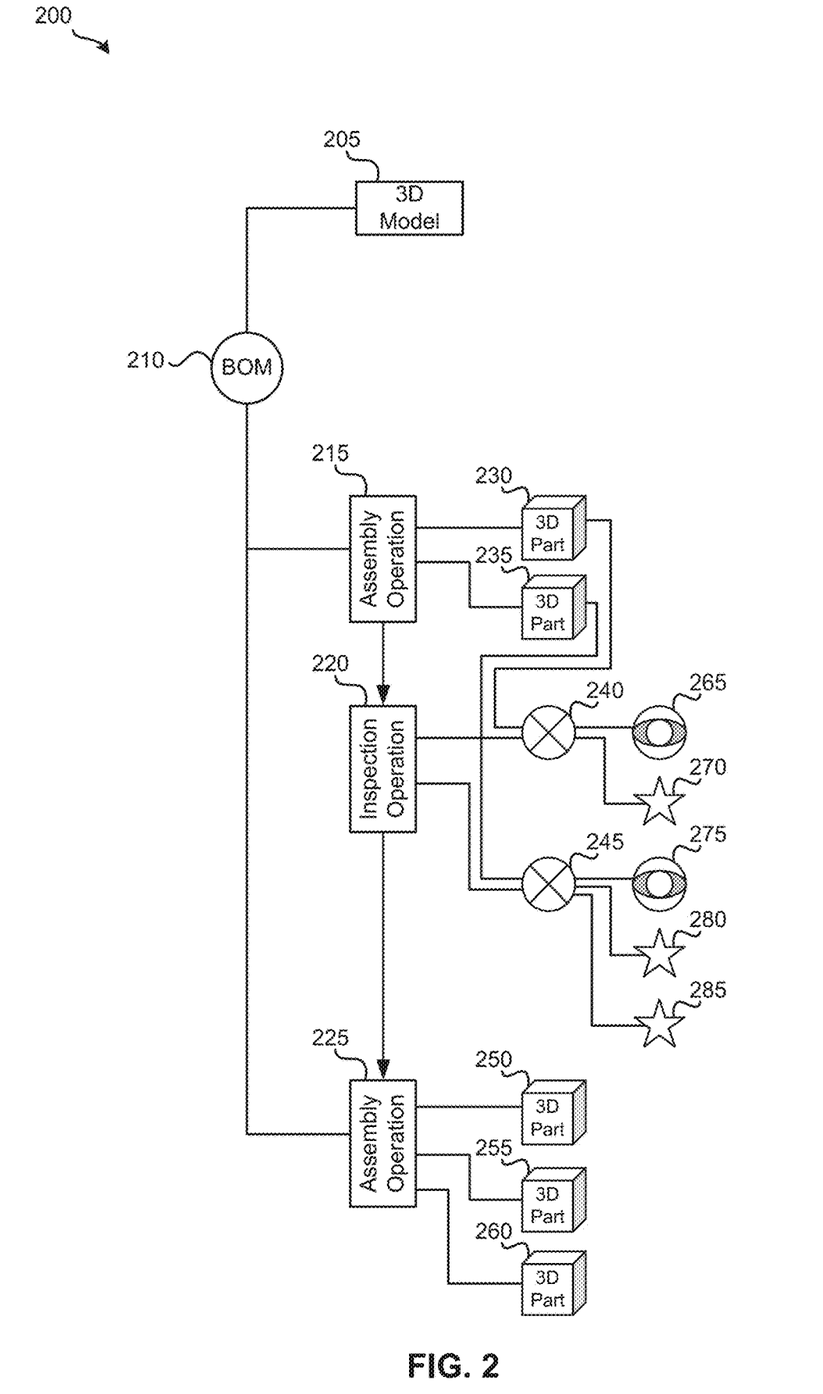
FIG. 2 conceptually illustrates an example data structure of an assembly and inspection plan according to some embodiments.

FIG. 2 conceptually illustrates an example data structure of an assembly and inspection plan 200 according to some embodiments. In particular, assembly and inspection plan 200 is the assembly and inspection plan that was edited in this example. As shown, assembly and inspection plan 200 includes 3D model 205, BOM 210, assembly operation 215, inspection operation 220, and assembly operation 225. For this example, 3D model 205 is a 3D model of a product that includes a several parts. BOM 210 is a list of the parts in 3D model 205. Each part in 3D model 205 has a unique part number associated with it.

Assembly operation 215 is a first operation (i.e., a first assembly operation) in assembly and inspection plan 200. As shown, assembly operation 215 specifies parts 230 in 3D model 205 and part 235 in 3D model 205 as well as instructions (not shown) for how to assemble parts 230 and 235 together. Inspection operation 220 is a second operation (i.e., a first inspection operation) in assembly and inspection plan 200. As illustrated, inspection operation 220 includes two inspection tasks 240 and 245. Inspection task 240 defines part 230 as the part that is to be inspected along with a set of inspection instructions to perform on part 230 (not shown). Additionally, inspection task 240 includes view 265 and part reference 270. View 265 is a view of 3D model 205 that shows part 230 in 3D model 205. Part reference 270 is a reference to a region of part 230 in 3D model 205. Inspection task 245 defines part 235 as the part that is to be inspected as well as a set of inspection instructions to perform on part 235 (not shown). Inspection task 245 also includes view 275 and part references 280 and 285. View 275 is a view of 3D model 205 that shows part 235 in 3D model 205. Part reference 280 is a first reference to a first region of part 235 in 3D model 205 and part reference 285 is a second reference to a second region of part 235 in 3D model 205. Assembly operation 225 is a third operation (i.e., a second assembly operation) in assembly and inspection plan 200. As shown, assembly operation 225 specifies parts 250-260 in 3D model 205 along with instructions (not shown) for how to assembly parts 250-260 together.

Figure 3A:
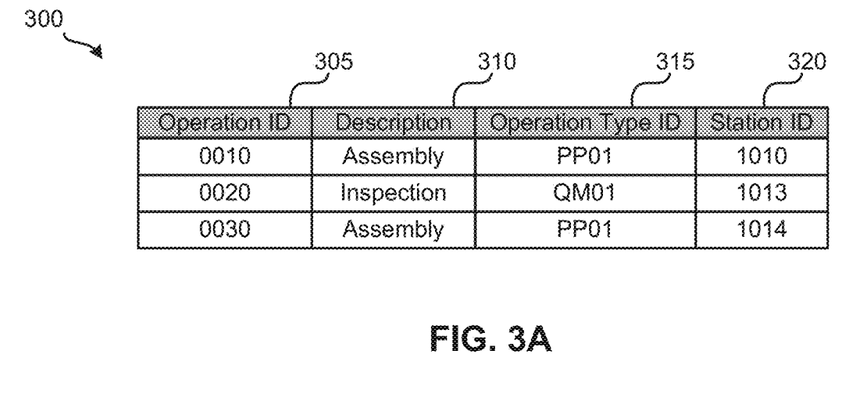
FIGS. 3A and 3B illustrate examples of data for defining the assembly and inspection plan illustrated in FIG. 2 according to some embodiments according to some embodiments.
Figure 3B:
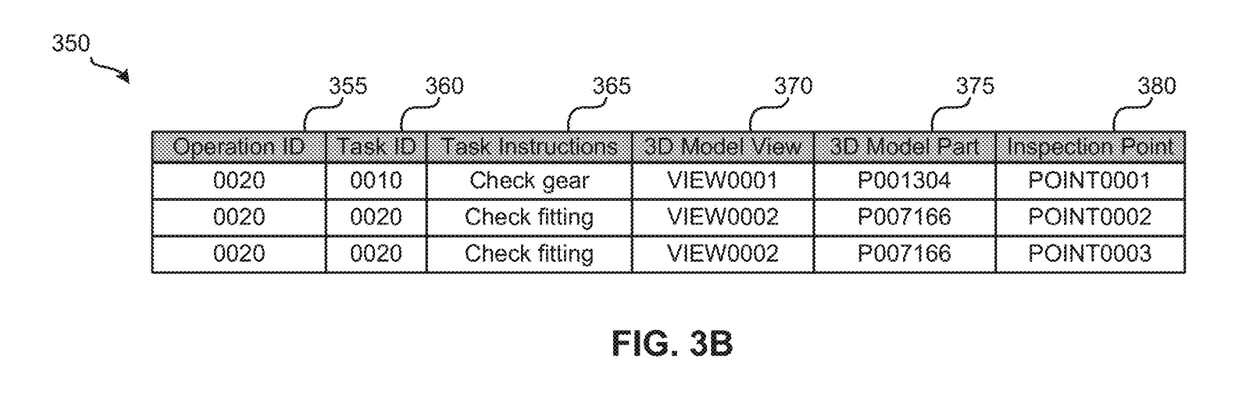
Figure 4:
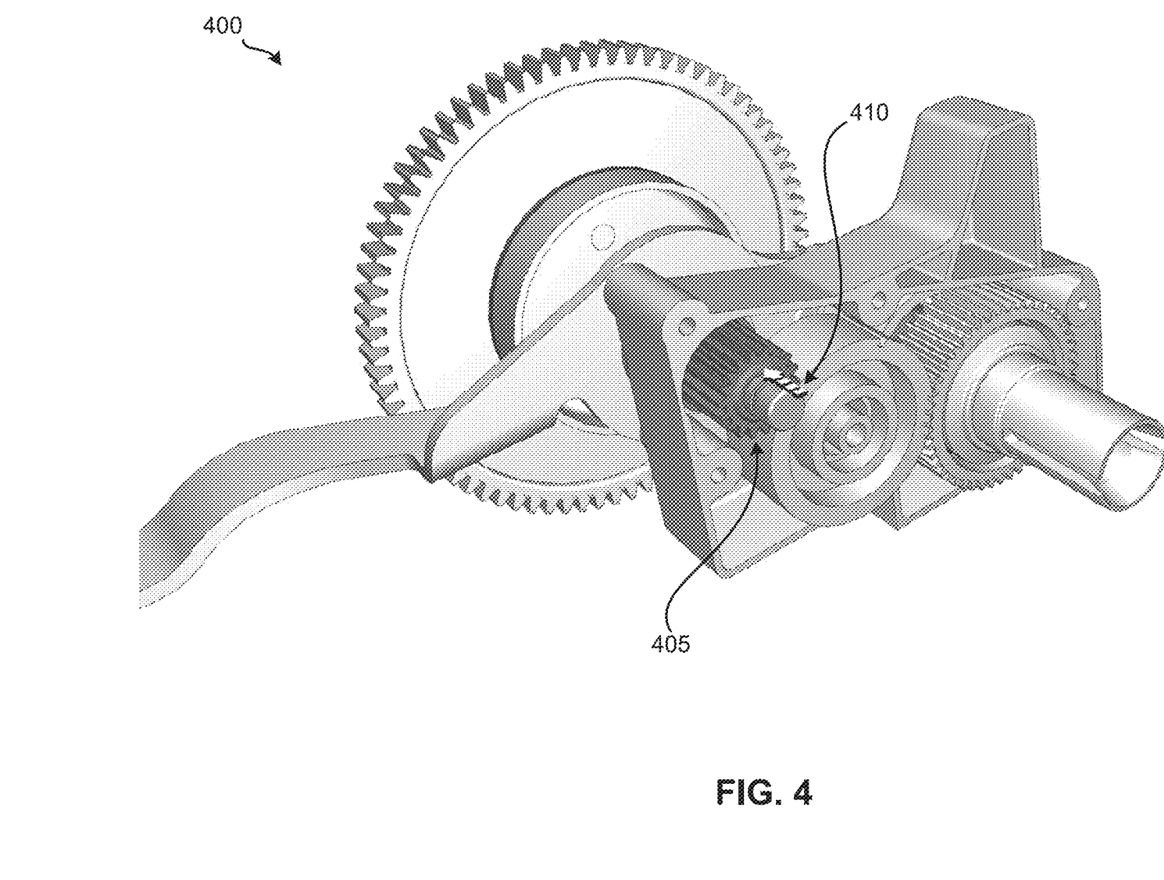
FIG. 4 illustrates an example of data in a 3D model associated with an inspection task according to some embodiments.

FIGS. 3A and 3B illustrate examples of data for defining assembly and inspection plan 200 according to some embodiments. Specifically, FIG. 3A illustrates a table 300, which defines the operations in assembly and inspection plan 200. As shown, table 300 includes columns 305-320. Column 305 is configured to store a unique identifier associated with an operation. In this example, the unique identifiers also indicate the order of the operations. That is, the operation associated with operation ID 0010 is to be performed first, the operation associated with operation ID 0020 is to be performed second, and the operation associated with operation ID 0030 is to be performed third. Column 310 stores a description of the type of operation while column 315 stores a unique identifier associated with the type of operation. Column 320 is configured to store a unique identifier associated with a station at which the operation is to be performed (e.g., a station on a shop floor of an assembly plant). For this example, the first row in table 300 defines assembly operation 215, the second row in table 300 defines inspection operation 220, and the third row in tabled 300 defines assembly operation 225.

FIG. 3B illustrates a table 350, which defines the inspection tasks in inspection operation 220. As illustrated, table 350 includes columns 355-380. Column 355 stores a unique identifier of an operation with which an inspection is associated. Colum 360 is configured to store an identifier associated with an inspection task. Column 365 stores task instructions for the inspection task. Column 370 is configured to store a view of a 3D model in terms of a position of a virtual camera in a 3D space of the 3D model (e.g., a set of x, y, and z coordinates in the 3D space of the 3D model) and a focal length of the virtual camera used to view the 3D model. Column 375 stores a part number of a part in 3D model 205. Finally, column 380 is configured to store a reference to a region of the part in 3D model 205. The region of the part may be defined in terms of a surface of the part or a point (e.g., a set of x, y, and z coordinates in the 3D space of the 3D model) on a surface of the part. The reference to the region of the part in the 3D model can include an annotation to the region of the part (e.g., an arrow, a highlight, etc.).

In this example, the first row in table 350 defines inspection task 240. The view stored in the first row of column 370 defines view 265, the part stored in the first row of column 375 defines part 230, and the reference to a region of part 230 stored in the first row of column 380 defines part reference 270. FIG. 4 illustrates an example of data in a 3D model associated with an inspection task according to some embodiments. In particular, FIG. 4 illustrates a view of 3D model 400, 3D model part 405 of 3D model 400, and reference 410 to 3D model part 405 for inspection task 240, which is defined by the first row of table 350. The view of 3D model 400 is defined in terms of a position of a virtual camera in a 3D space of the 3D model (e.g., a set of x, y, and z coordinates in the 3D space of the 3D model) and a focal length of the virtual camera used to view the 3D model. The position and focal length of the virtual camera is represented as VIEW0001 in the first row of column 370. For this example, reference 410 is a point on the surface of 3D part 405 and includes an arrow annotation to the point as illustrated in FIG. 4.

Returning to FIG. 3B, the second row in table 350 defines inspection task 245. The view stored in the second row of column 370 defines view 275, the part stored in second row of column 275 defines part 235, and the reference to a region of part 235 stored in the second row of column 380 defines part reference 280. The third row in table 350 has the same 3D model view and 3D model part as the second row. The reference to a region of part 235 stored in the third row of column 380 defines part reference 285.

Figure 5:
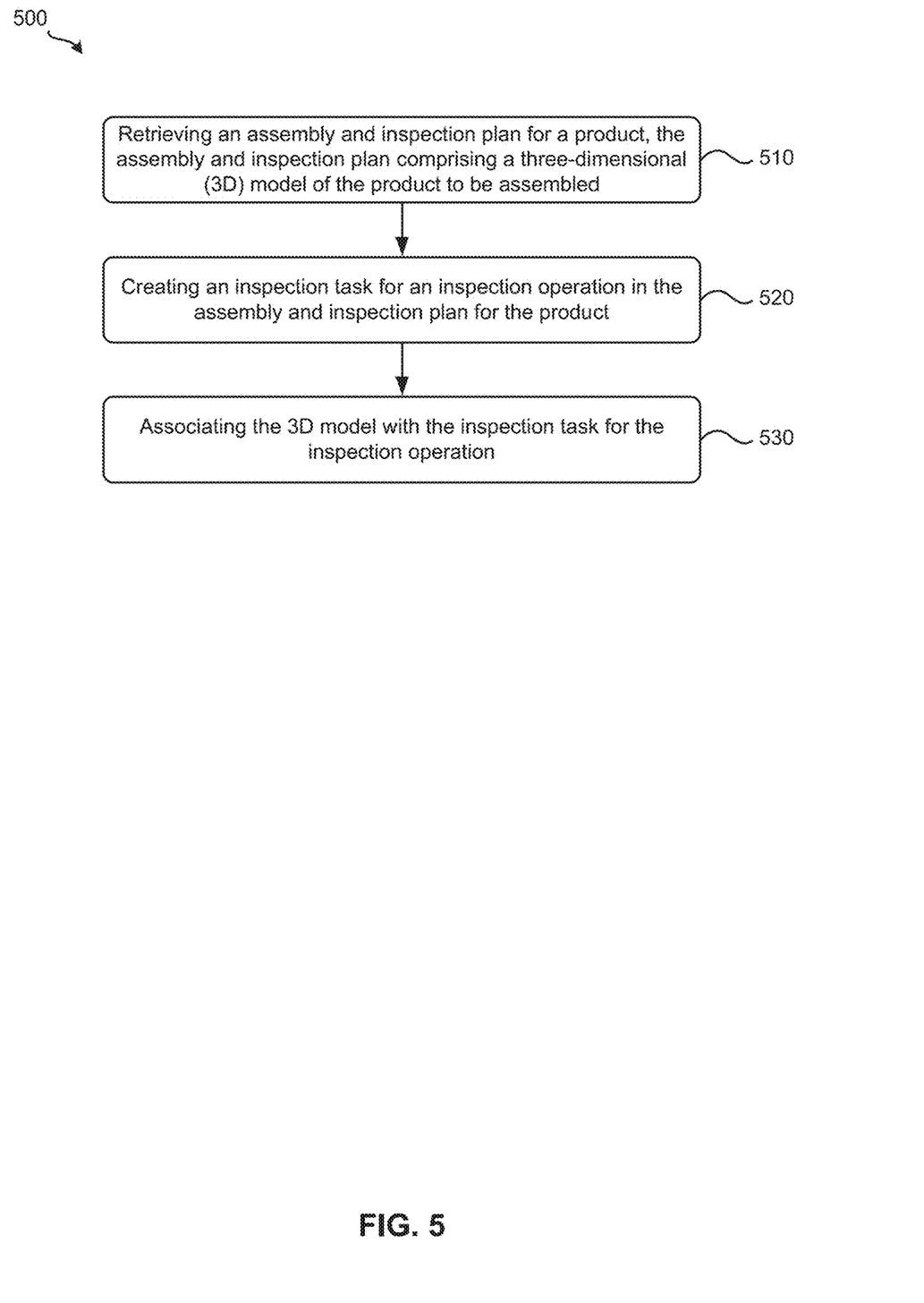
FIG. 5 illustrates a process for incorporating 3D model data into an assembly and inspection plan according to some embodiments.

FIG. 5 illustrates a process 500 for incorporating 3D model data into an assembly and inspection plan according to some embodiments. In some embodiments, computing system 115 (e.g., visual inspection planner 125) performs process 500. Process 500 begins by retrieving, at 510, an assembly and inspection plan for a product. The assembly and inspection plan includes a three-dimensional (3D) model of the product to be assembled. Referring to FIGS. 1 and 2 as an example, visual inspection planner 125 may retrieve assembly and inspection plan 200 from assembly and inspection data storage 145. Visual inspection planner 125 can perform operation 510 in response to receiving from a user of a client device 110 a request to edit assembly and inspection plan 200.

Next, process 500 creates, at 520, an inspection task for an inspection operation in the assembly and inspection plan for the product. Referring to FIGS. 1-3 as an example, visual inspection planner 125 can create inspection task 240 for inspection operation 220 in assembly and inspection operation 200. Creating inspection 240 may involve receiving from a user of a client device 110 editing assembly and inspection plan 200 values for columns 355-365 shown in the first row of table 350 and then creating the first row in table 350.

Finally, process 500 associates, at 530, the 3D model with the inspection task for the inspection operation. Referring to FIGS. 1-3 as an example, visual inspection planner 125 may associate 3D model 205 with inspection task 240. In particular, visual inspection planner 125 can receive from a user of a client device 110 editing assembly and inspection plan 200 a definition of 3D model view, 3D model part 230, and a reference to a region of 3D model part 230.

Figure 6:
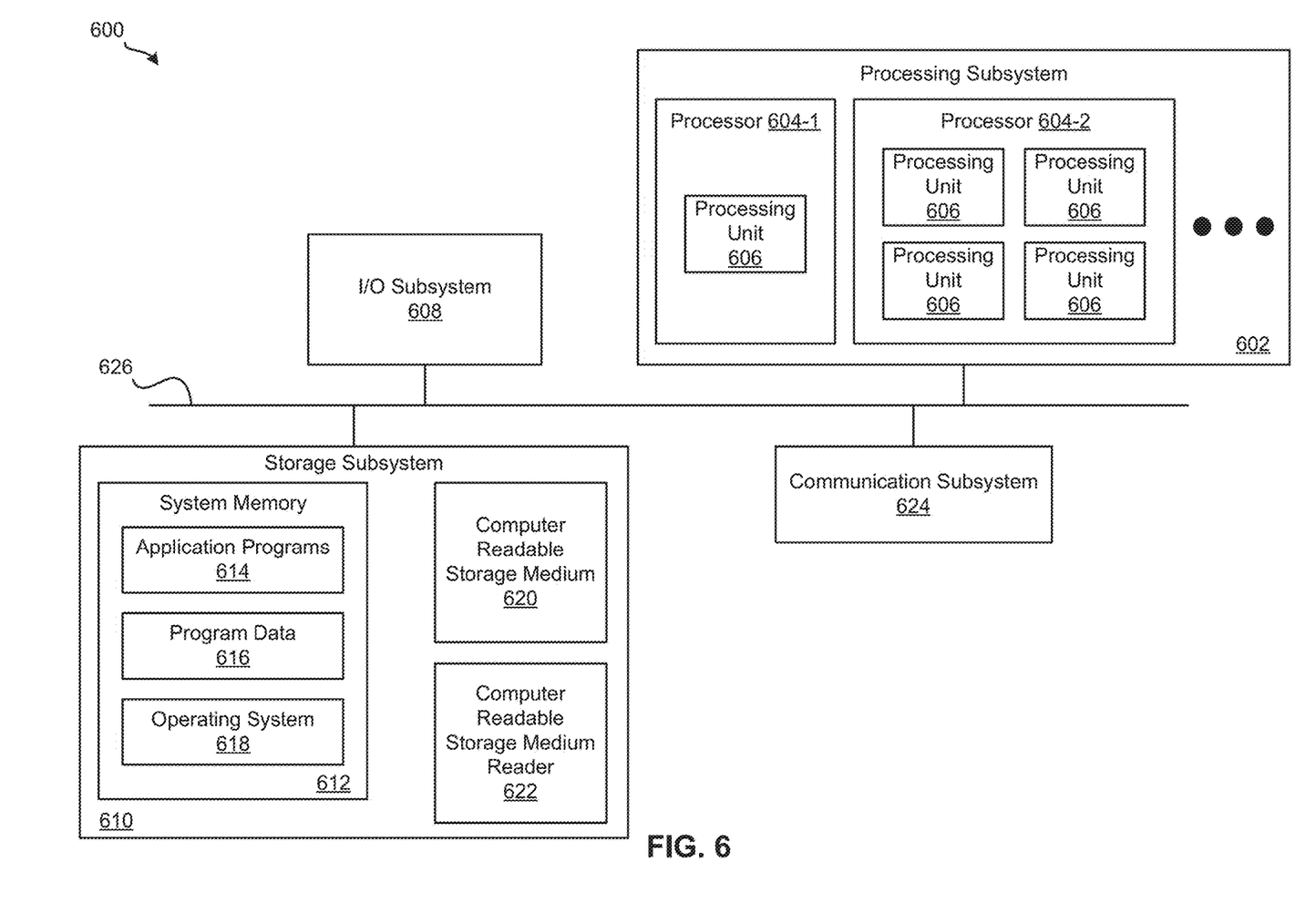
FIG. 6 illustrates an exemplary computer system, in which various embodiments may be implemented.

FIG. 6 illustrates an exemplary computer system 600 for implementing various embodiments described above. For example, computer system 600 may be used to implement CAD system 105, client devices 110a-110n, and computing system 115. Computer system 600 may be a desktop computer, a laptop, a server computer, or any other type of computer system or combination thereof. Some or all elements of visual data generator 120, visual inspection planner 125, visual inspection results manager 130, or combinations thereof can be included or implemented in computer system 600. In addition, computer system 600 can implement many of the operations, methods, and/or processes described above (e.g., process 500). As shown in FIG. 6, computer system 600 includes processing subsystem 602, which communicates, via bus subsystem 626, with input/output (I/O) subsystem 608, storage subsystem 610 and communication subsystem 624.

Bus subsystem 626 is configured to facilitate communication among the various components and subsystems of computer system 600. While bus subsystem 626 is illustrated in FIG. 6 as a single bus, one of ordinary skill in the art will understand that bus subsystem 626 may be implemented as multiple buses. Bus subsystem 626 may be any of several types of bus structures (e.g., a memory bus or memory controller, a peripheral bus, a local bus, etc.) using any of a variety of bus architectures. Examples of bus architectures may include an Industry Standard Architecture (ISA) bus, a Micro Channel Architecture (MCA) bus, an Enhanced ISA (EISA) bus, a Video Electronics Standards Association (VESA) local bus, a Peripheral Component Interconnect (PCI) bus, a Universal Serial Bus (USB), etc.

Processing subsystem 602, which can be implemented as one or more integrated circuits (e.g., a conventional microprocessor or microcontroller), controls the operation of computer system 600. Processing subsystem 602 may include one or more processors 604. Each processor 604 may include one processing unit 606 (e.g., a single core processor such as processor 604-1) or several processing units 606 (e.g., a multicore processor such as processor 604-2). In some embodiments, processors 604 of processing subsystem 602 may be implemented as independent processors while, in other embodiments, processors 604 of processing subsystem 602 may be implemented as multiple microprocessors integrate into a single chip or multiple chips. Still, in some embodiments, processors 604 of processing subsystem 602 may be implemented as a combination of independent processors and multiple processors integrated into a single chip or multiple chips.

In some embodiments, processing subsystem 602 can execute a variety of programs or processes in response to program code and can maintain multiple concurrently executing programs or processes. At any given time, some or all of the program code to be executed can reside in processing subsystem 602 and/or in storage subsystem 610. Through suitable programming, processing subsystem 602 can provide various functionalities, such as the functionalities described above by reference to process 500.

I/O subsystem 608 may include any number of user interface input devices and/or user interface output devices. User interface input devices may include a keyboard, pointing devices (e.g., a mouse, a trackball, etc.), a touchpad, a touch screen incorporated into a display, a scroll wheel, a click wheel, a dial, a button, a switch, a keypad, audio input devices with voice recognition systems, microphones, image/video capture devices (e.g., webcams, image scanners, barcode readers, etc.), motion sensing devices, gesture recognition devices, eye gesture (e.g., blinking) recognition devices, biometric input devices, and/or any other types of input devices.

User interface output devices may include visual output devices (e.g., a display subsystem, indicator lights, etc.), audio output devices (e.g., speakers, headphones, etc.), etc. Examples of a display subsystem may include a cathode ray tube (CRT), a flat-panel device (e.g., a liquid crystal display (LCD), a plasma display, etc.), a projection device, a touch screen, and/or any other types of devices and mechanisms for outputting information from computer system 600 to a user or another device (e.g., a printer).

As illustrated in FIG. 6, storage subsystem 610 includes system memory 612, computer-readable storage medium 620, and computer-readable storage medium reader 622. System memory 612 may be configured to store software in the form of program instructions that are loadable and executable by processing subsystem 602 as well as data generated during the execution of program instructions. In some embodiments, system memory 612 may include volatile memory (e.g., random access memory (RAM)) and/or non-volatile memory (e.g., read-only memory (ROM), programmable read-only memory (PROM), erasable programmable read-only memory (EPROM), electrically erasable programmable read-only memory (EEPROM), flash memory, etc.). System memory 612 may include different types of memory, such as static random access memory (SRAM) and/or dynamic random access memory (DRAM). System memory 612 may include a basic input/output system (BIOS), in some embodiments, that is configured to store basic routines to facilitate transferring information between elements within computer system 600 (e.g., during start-up). Such a BIOS may be stored in ROM (e.g., a ROM chip), flash memory, or any other type of memory that may be configured to store the BIOS.

As shown in FIG. 6, system memory 612 includes application programs 614, program data 616, and operating system (OS) 618. OS 618 may be one of various versions of Microsoft Windows, Apple Mac OS, Apple OS X, Apple macOS, and/or Linux operating systems, a variety of commercially-available UNIX or UNIX-like operating systems (including without limitation the variety of GNU/Linux operating systems, the Google Chrome® OS, and the like) and/or mobile operating systems such as Apple iOS, Windows Phone, Windows Mobile, Android, BlackBerry OS, Blackberry 10, and Palm OS, WebOS operating systems.

Computer-readable storage medium 620 may be a non-transitory computer-readable medium configured to store software (e.g., programs, code modules, data constructs, instructions, etc.). Many of the components (e.g., visual data generator 120, visual inspection planner 125, and visual inspection results manager 130) and/or processes (e.g., process 500) described above may be implemented as software that when executed by a processor or processing unit (e.g., a processor or processing unit of processing subsystem 602) performs the operations of such components and/or processes. Storage subsystem 610 may also store data used for, or generated during, the execution of the software.

Storage subsystem 610 may also include computer-readable storage medium reader 622 that is configured to communicate with computer-readable storage medium 620. Together and, optionally, in combination with system memory 612, computer-readable storage medium 620 may comprehensively represent remote, local, fixed, and/or removable storage devices plus storage media for temporarily and/or more permanently containing, storing, transmitting, and retrieving computer-readable information.

Computer-readable storage medium 620 may be any appropriate media known or used in the art, including storage media such as volatile, non-volatile, removable, non-removable media implemented in any method or technology for storage and/or transmission of information. Examples of such storage media includes RAM, ROM, EEPROM, flash memory or other memory technology, compact disc read-only memory (CD-ROM), digital versatile disk (DVD), Blu-ray Disc (BD), magnetic cassettes, magnetic tape, magnetic disk storage (e.g., hard disk drives), Zip drives, solid-state drives (SSD), flash memory card (e.g., secure digital (SD) cards, CompactFlash cards, etc.), USB flash drives, or any other type of computer-readable storage media or device.

Communication subsystem 624 serves as an interface for receiving data from, and transmitting data to, other devices, computer systems, and networks. For example, communication subsystem 624 may allow computer system 600 to connect to one or more devices via a network (e.g., a personal area network (PAN), a local area network (LAN), a storage area network (SAN), a campus area network (CAN), a metropolitan area network (MAN), a wide area network (WAN), a global area network (GAN), an intranet, the Internet, a network of any number of different types of networks, etc.). Communication subsystem 624 can include any number of different communication components. Examples of such components may include radio frequency (RF) transceiver components for accessing wireless voice and/or data networks (e.g., using cellular technologies such as 2G, 3G, 4G, 5G, etc., wireless data technologies such as Wi-Fi, Bluetooth, ZigBee, etc., or any combination thereof), global positioning system (GPS) receiver components, and/or other components. In some embodiments, communication subsystem 624 may provide components configured for wired communication (e.g., Ethernet) in addition to or instead of components configured for wireless communication.

One of ordinary skill in the art will realize that the architecture shown in FIG. 6 is only an example architecture of computer system 600, and that computer system 600 may have additional or fewer components than shown, or a different configuration of components. The various components shown in FIG. 6 may be implemented in hardware, software, firmware or any combination thereof, including one or more signal processing and/or application specific integrated circuits.

Figure 7:
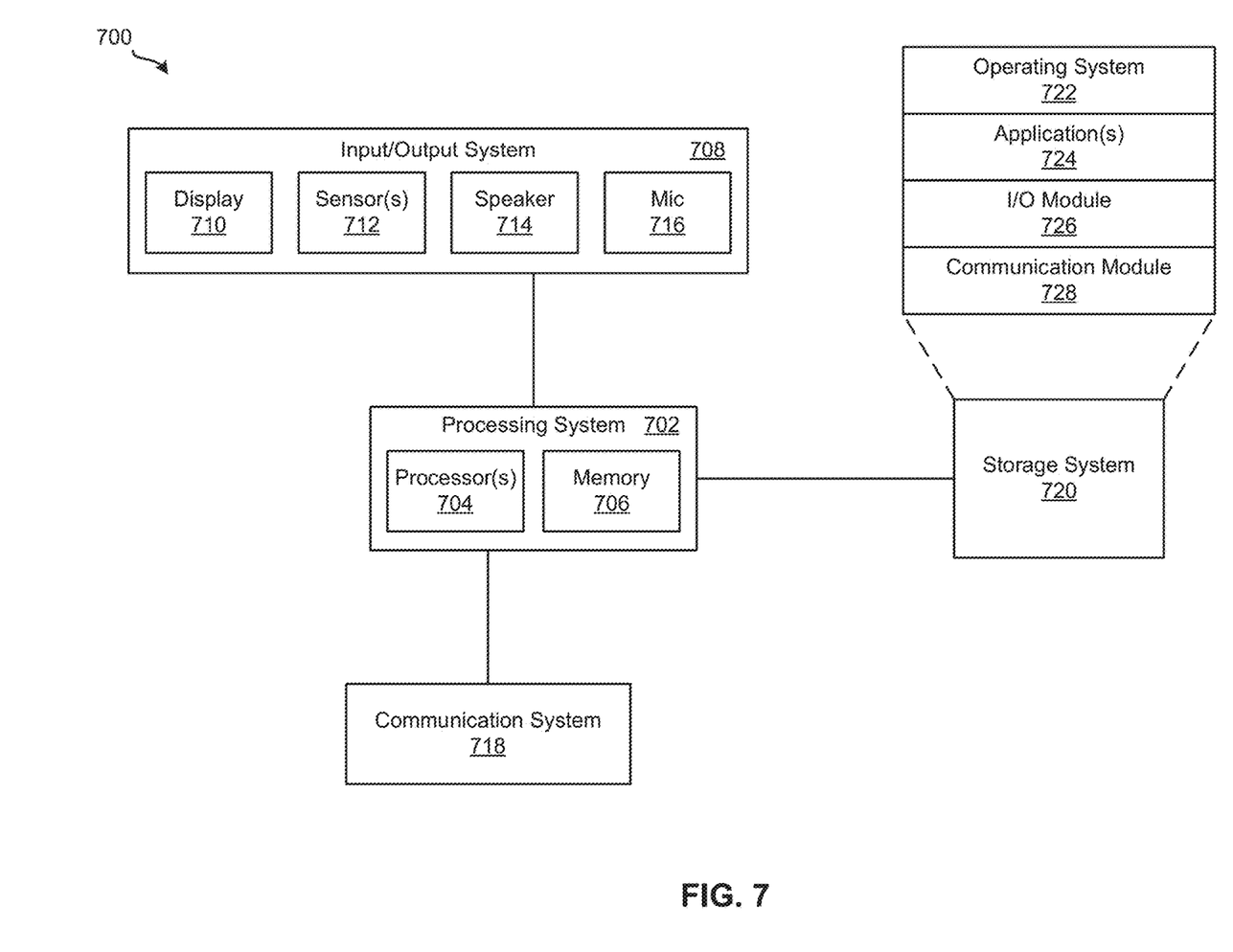
FIG. 7 illustrates an exemplary computing device, in which various embodiments may be implemented.

FIG. 7 illustrates an exemplary computing device 700 for implementing various embodiments described above. For example, computing device 700 may be used to implement client devices 110a-110n. Computing device 700 may be a cellphone, a smartphone, a wearable device, an activity tracker or manager, a tablet, a personal digital assistant (PDA), a media player, or any other type of mobile computing device or combination thereof. As shown in FIG. 7, computing device 700 includes processing system 702, input/output (I/O) system 708, communication system 718, and storage system 720. These components may be coupled by one or more communication buses or signal lines.

Processing system 702, which can be implemented as one or more integrated circuits (e.g., a conventional microprocessor or microcontroller), controls the operation of computing device 700. As shown, processing system 702 includes one or more processors 704 and memory 706. Processors 704 are configured to run or execute various software and/or sets of instructions stored in memory 706 to perform various functions for computing device 700 and to process data.

Each processor of processors 704 may include one processing unit (e.g., a single core processor) or several processing units (e.g., a multicore processor). In some embodiments, processors 704 of processing system 702 may be implemented as independent processors while, in other embodiments, processors 704 of processing system 702 may be implemented as multiple processors integrate into a single chip. Still, in some embodiments, processors 704 of processing system 702 may be implemented as a combination of independent processors and multiple processors integrated into a single chip.

Memory 706 may be configured to receive and store software (e.g., operating system 722, applications 724, I/O module 726, communication module 728, etc. from storage system 720) in the form of program instructions that are loadable and executable by processors 704 as well as data generated during the execution of program instructions. In some embodiments, memory 706 may include volatile memory (e.g., random access memory (RAM)), non-volatile memory (e.g., read-only memory (ROM), programmable read-only memory (PROM), erasable programmable read-only memory (EPROM), electrically erasable programmable read-only memory (EEPROM), flash memory, etc.), or a combination thereof.

I/O system 708 is responsible for receiving input through various components and providing output through various components. As shown for this example, I/O system 708 includes display 710, one or more sensors 712, speaker 714, and microphone 716. Display 710 is configured to output visual information (e.g., a graphical user interface (GUI) generated and/or rendered by processors 704). In some embodiments, display 710 is a touch screen that is configured to also receive touch-based input. Display 710 may be implemented using liquid crystal display (LCD) technology, light-emitting diode (LED) technology, organic LED (OLED) technology, organic electro luminescence (OEL) technology, or any other type of display technologies. Sensors 712 may include any number of different types of sensors for measuring a physical quantity (e.g., temperature, force, pressure, acceleration, orientation, light, radiation, etc.). Speaker 714 is configured to output audio information and microphone 716 is configured to receive audio input. One of ordinary skill in the art will appreciate that I/O system 708 may include any number of additional, fewer, and/or different components. For instance, I/O system 708 may include a keypad or keyboard for receiving input, a port for transmitting data, receiving data and/or power, and/or communicating with another device or component, an image capture component for capturing photos and/or videos, etc.

Communication system 718 serves as an interface for receiving data from, and transmitting data to, other devices, computer systems, and networks. For example, communication system 718 may allow computing device 700 to connect to one or more devices via a network (e.g., a personal area network (PAN), a local area network (LAN), a storage area network (SAN), a campus area network (CAN), a metropolitan area network (MAN), a wide area network (WAN), a global area network (GAN), an intranet, the Internet, a network of any number of different types of networks, etc.). Communication system 718 can include any number of different communication components. Examples of such components may include radio frequency (RF) transceiver components for accessing wireless voice and/or data networks (e.g., using cellular technologies such as 2G, 3G, 4G, 5G, etc., wireless data technologies such as Wi-Fi, Bluetooth, ZigBee, etc., or any combination thereof), global positioning system (GPS) receiver components, and/or other components. In some embodiments, communication system 718 may provide components configured for wired communication (e.g., Ethernet) in addition to or instead of components configured for wireless communication.

Storage system 720 handles the storage and management of data for computing device 700. Storage system 720 may be implemented by one or more non-transitory machine-readable mediums that are configured to store software (e.g., programs, code modules, data constructs, instructions, etc.) and store data used for, or generated during, the execution of the software.

In this example, storage system 720 includes operating system 722, one or more applications 724, I/O module 726, and communication module 728. Operating system 722 includes various procedures, sets of instructions, software components and/or drivers for controlling and managing general system tasks (e.g., memory management, storage device control, power management, etc.) and facilitates communication between various hardware and software components. Operating system 722 may be one of various versions of Microsoft Windows, Apple Mac OS, Apple OS X, Apple macOS, and/or Linux operating systems, a variety of commercially-available UNIX or UNIX-like operating systems (including without limitation the variety of GNU/Linux operating systems, the Google Chrome® OS, and the like) and/or mobile operating systems such as Apple iOS, Windows Phone, Windows Mobile, Android, BlackBerry OS, Blackberry 10, and Palm OS, WebOS operating systems.

Applications 724 can include any number of different applications installed on computing device 700. Examples of such applications may include a browser application, an address book application, a contact list application, an email application, an instant messaging application, a word processing application, JAVA-enabled applications, an encryption application, a digital rights management application, a voice recognition application, location determination application, a mapping application, a music player application, etc.

I/O module 726 manages information received via input components (e.g., display 710, sensors 712, and microphone 716) and information to be outputted via output components (e.g., display 710 and speaker 714). Communication module 728 facilitates communication with other devices via communication system 718 and includes various software components for handling data received from communication system 718.

One of ordinary skill in the art will realize that the architecture shown in FIG. 7 is only an example architecture of computing device 700, and that computing device 700 may have additional or fewer components than shown, or a different configuration of components. The various components shown in FIG. 7 may be implemented in hardware, software, firmware or any combination thereof, including one or more signal processing and/or application specific integrated circuits.

Figure 8:
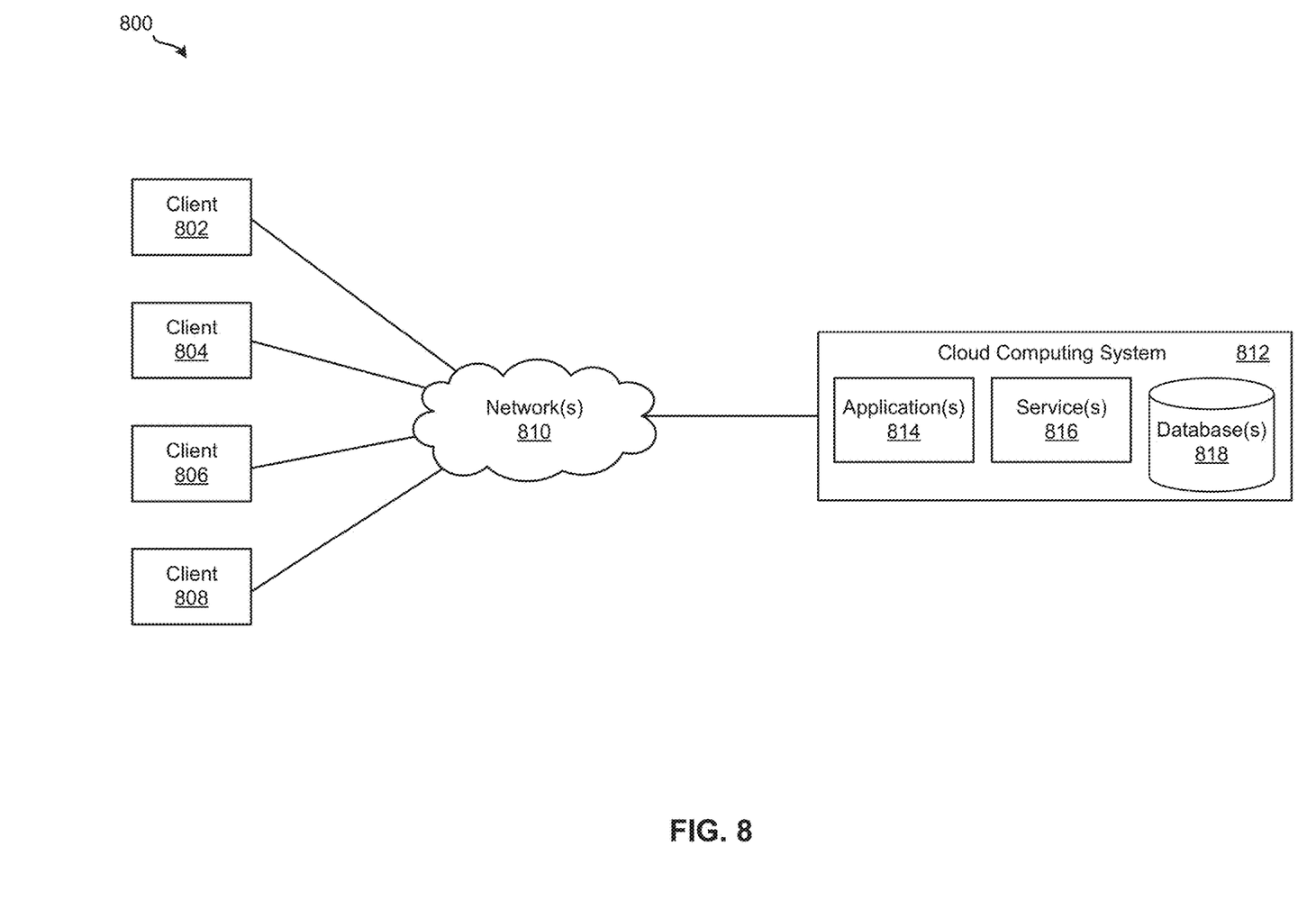
FIG. 8 illustrates an exemplary system, in which various embodiments may be implemented.

FIG. 8 illustrates an exemplary system 800 for implementing various embodiments described above. For example, client devices 802-808 of system 800 may be used to implement client devices 110a-110n and cloud computing system 812 of system 800 may be used to implement computing system 115. As shown, system 800 includes client devices 802-808, one or more networks 810, and cloud computing system 812. Cloud computing system 812 is configured to provide resources and data to client devices 802-808 via networks 810. In some embodiments, cloud computing system 800 provides resources to any number of different users (e.g., customers, tenants, organizations, etc.). Cloud computing system 812 may be implemented by one or more computer systems (e.g., servers), virtual machines operating on a computer system, or a combination thereof.

As shown, cloud computing system 812 includes one or more applications 814, one or more services 816, and one or more databases 818. Cloud computing system 800 may provide applications 814, services 816, and databases 818 to any number of different customers in a self-service, subscription-based, elastically scalable, reliable, highly available, and secure manner.

In some embodiments, cloud computing system 800 may be adapted to automatically provision, manage, and track a customer's subscriptions to services offered by cloud computing system 800. Cloud computing system 800 may provide cloud services via different deployment models. For example, cloud services may be provided under a public cloud model in which cloud computing system 800 is owned by an organization selling cloud services and the cloud services are made available to the general public or different industry enterprises. As another example, cloud services may be provided under a private cloud model in which cloud computing system 800 is operated solely for a single organization and may provide cloud services for one or more entities within the organization. The cloud services may also be provided under a community cloud model in which cloud computing system 800 and the cloud services provided by cloud computing system 800 are shared by several organizations in a related community. The cloud services may also be provided under a hybrid cloud model, which is a combination of two or more of the aforementioned different models.

In some instances, any one of applications 814, services 816, and databases 818 made available to client devices 802-808 via networks 810 from cloud computing system 800 is referred to as a "cloud service." Typically, servers and systems that make up cloud computing system 800 are different from the on-premises servers and systems of a customer. For example, cloud computing system 800 may host an application and a user of one of client devices 802-808 may order and use the application via networks 810.

Applications 814 may include software applications that are configured to execute on cloud computing system 812 (e.g., a computer system or a virtual machine operating on a computer system) and be accessed, controlled, managed, etc. via client devices 802-808. In some embodiments, applications 814 may include server applications and/or mid-tier applications (e.g., HTTP (hypertext transport protocol) server applications, FTP (file transfer protocol) server applications, CGI (common gateway interface) server applications, JAVA server applications, etc.). Services 816 are software components, modules, application, etc. that are configured to execute on cloud computing system 812 and provide functionalities to client devices 802-808 via networks 810. Services 816 may be web-based services or on-demand cloud services.

Databases 818 are configured to store and/or manage data that is accessed by applications 814, services 816, and/or client devices 802-808. For instance, storages 135-150 may be stored in databases 818. Databases 818 may reside on a non-transitory storage medium local to (and/or resident in) cloud computing system 812, in a storage-area network (SAN), on a non-transitory storage medium local located remotely from cloud computing system 812. In some embodiments, databases 818 may include relational databases that are managed by a relational database management system (RDBMS). Databases 818 may be a column-oriented databases, row-oriented databases, or a combination thereof. In some embodiments, some or all of databases 818 are in-memory databases. That is, in some such embodiments, data for databases 818 are stored and managed in memory (e.g., random access memory (RAM)).

Client devices 802-808 are configured to execute and operate a client application (e.g., a web browser, a proprietary client application, etc.) that communicates with applications 814, services 816, and/or databases 818 via networks 810. This way, client devices 802-808 may access the various functionalities provided by applications 814, services 816, and databases 818 while applications 814, services 816, and databases 818 are operating (e.g., hosted) on cloud computing system 800. Client devices 802-808 may be computer system 600 or computing device 700, as described above by reference to FIGS. 6 and 7, respectively. Although system 800 is shown with four client devices, any number of client devices may be supported.

Networks 810 may be any type of network configured to facilitate data communications among client devices 802-808 and cloud computing system 812 using any of a variety of network protocols. Networks 810 may be a personal area network (PAN), a local area network (LAN), a storage area network (SAN), a campus area network (CAN), a metropolitan area network (MAN), a wide area network (WAN), a global area network (GAN), an intranet, the Internet, a network of any number of different types of networks, etc.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A non-transitory machine-readable medium storing a program executable by at least one processing unit of a device, the program comprising sets of instructions for:
    receiving, from a computing system, a three-dimensional (3D) model of a product to be assembled, the product comprising a set of parts;
    transforming a format of the 3D model from a first format to a second format, wherein a size of the 3D model in the second format is smaller than a size of the 3D model in the first format;
    retrieving an assembly and inspection plan for the product, the assembly and inspection plan comprising the 3D model of the product and a set of assembly operations, each assembly operation in the set of assembly operations comprising instructions for assembling a subset of the set of parts in the product;
    creating an inspection task for an inspection operation in the assembly and inspection plan for the product;
    associating the 3D model with the inspection task for the inspection operation;
    generating a self-contained file that includes the assembly and inspection plan for the product, the self-contained file enabling access of the assembly and inspection plan by a user of a computing device without connection to the device; and
    providing the self-contained file to the computing device, wherein when the computing device executes the self-contained file, the self-contained file enables the computing device to provide reference to the 3D model of the product during assembly and inspection of the product without connection to the device,
    wherein the receiving, the transforming, the retrieving, the creating, the associating, the generating, and the providing are performed by the at least one processing unit of the device,
    wherein the device and the computing device are different.

2. The non-transitory machine-readable medium of claim 1, wherein the program further comprises sets of instructions for:
    receiving a definition of a view of the 3D model;
    receiving a specification of a part in the 3D model; and
    receiving a definition of a reference to a region of the part in the 3D model.

3. The non-transitory machine-readable medium of claim 2, wherein associating the 3D model with the inspection task for the inspection operation comprises specifying in the assembly and inspection plan the definition of the view of the 3D model, the specification of the part in the 3D model, and the definition of the reference to the region of the part in the 3D model for the inspection task of the inspection operation.

4. The non-transitory machine-readable medium of claim 3, wherein the inspection task comprises instructions for inspecting a part in the set of parts in the 3D model.

5. The non-transitory machine-readable medium of claim 1, wherein the inspection task is a first inspection task, wherein the program further comprises sets of instructions for:
    creating a second inspection task for the inspection operation in the assembly and inspection plan for the product; and
    associating the 3D model with the second inspection task for the inspection operation.

6. The non-transitory machine-readable medium of claim 1, wherein the inspection task is a first inspection task, wherein the program further comprises sets of instructions for:
    creating a second inspection task for a second inspection operation in the assembly and inspection plan for the product; and
    associating the 3D model with the second inspection task for the second inspection operation.

7. The non-transitory machine-readable medium of claim 1, wherein the program further comprises a set of instructions for receiving a request to edit the assembly and inspection plan for the product, wherein retrieving the assembly and inspection plan for the product is performed in response to receiving the request.

8. The non-transitory machine-readable medium of claim 1, wherein transforming the format of the 3D model from the first format to the second format comprises removing CAD specific information from the first format of the 3D model.

9. The non-transitory machine-readable medium of claim 1, wherein the program further comprises a set of instructions for receiving, from a client device, the inspection task for the inspection operation in the assembly and inspection plan for the product, wherein the inspection task for the inspection operation in the assembly and inspection plan for the product is created in response to receiving the inspection task from the client device.

10. The non-transitory machine-readable medium of claim 1, wherein the program further comprises a set of instructions for receiving, from a client device, the inspection task for the inspection operation in the assembly and inspection plan for the product, wherein the inspection task for the inspection operation in the assembly and inspection plan for the product is created in response to receiving the inspection task from the client device.

11. The non-transitory machine-readable medium of claim 1, wherein when the computing device executes the self-contained file, the self-contained file enables the computing device to provide reference to the 3D model of the product without network access.

12. A method executable by a device, the method comprising:
    receiving, from a computing system, a three-dimensional (3D) model of a product to be assembled, the product comprising a set of parts;
    transforming a format of the 3D model from a first format to a second format, wherein a size of the 3D model in the second format is smaller than a size of the 3D model in the first format;
    retrieving an assembly and inspection plan for the product, the assembly and inspection plan comprising the 3D model of the product and a set of assembly operations, each assembly operation in the set of assembly operations comprising instructions for assembling a subset of the set of parts in the product;
    creating an inspection task for an inspection operation in the assembly and inspection plan for the product;
    associating the 3D model with the inspection task for the inspection operation;
    generating a self-contained file that includes the assembly and inspection plan for the product, the self-contained file enabling access of the assembly and inspection plan by a user of a computing device without connection to the device; and
    providing the self-contained file to the computing device for, wherein when the computing device executes the self-contained file, the self-contained file enables the computing device to provide reference to the 3D model of the product during assembly and inspection of the product without connection to the device,
wherein the receiving, the transforming, the retrieving, the creating, the associating, the generating, and the providing are performed by the at least one processing unit of the device,
wherein the device and the computing device are different.

13. The method of claim 12 further comprising:
receiving a definition of a view of the 3D model;
receiving a specification of a part in the 3D model; and
receiving a definition of a reference to a region of the part in the 3D model.

14. The method of claim 13, wherein associating the 3D model with the inspection task for the inspection operation comprises specifying in the assembly and inspection plan the definition of the view of the 3D model, the specification of the part in the 3D model, and the definition of the reference to the region of the part in the 3D model for the inspection task of the inspection operation.

15. The method of claim 14, wherein the inspection task comprises instructions for inspecting a part in the set of parts in the 3D model.

16. The method of claim 12, wherein the inspection task is a first inspection task, wherein the method further comprises:
creating a second inspection task for the inspection operation in the assembly and inspection plan for the product; and
associating the 3D model with the second inspection task for the inspection operation.

17. The method of claim 12, wherein the inspection task is a first inspection task, wherein the method further comprises:
creating a second inspection task for a second inspection operation in the assembly and inspection plan for the product; and
associating the 3D model with the second inspection task for the second inspection operation.

18. The method of claim 12 further comprising receiving a request to edit the assembly and inspection plan for the product, wherein retrieving the assembly and inspection plan for the product is performed in response to receiving the request.

19. A system comprising:
a set of processors; and
a non-transitory machine-readable medium storing instructions that when executed by at least one processor in the set of processors cause the at least one processor to:
receive, from a computing system, a three-dimensional (3D) model of a product to be assembled, the product comprising a set of parts;
transform a format of the 3D model from a first format to a second format, wherein a size of the 3D model in the second format is smaller than a size of the 3D model in the first format;
retrieve an assembly and inspection plan for the product, the assembly and inspection plan comprising the 3D model of the product and a set of assembly operations, each assembly operation in the set of assembly operations comprising instructions for assembling a subset of the set of parts in the product;
create an inspection task for an inspection operation in the assembly and inspection plan for the product;
associate the 3D model with the inspection task for the inspection operation;
generate a self-contained file that includes the assembly and inspection plan for the product, the self-contained file enabling access of the assembly and inspection plan by a user of a computing device without connection to the device; and
provide the self-contained file to the computing device, wherein when the computing device executes the self-contained file, the self-contained file enables the computing device to provide reference to the 3D model of the product during assembly and inspection of the product without connection to the device,
wherein the receiving, the transforming, the retrieving, the creating, the associating, the generating, and the providing are performed by the at least one processor of the system,
wherein the system and the computing device are different.

20. The system of claim 19, wherein the instructions further cause the at least one processor to:
receive a definition of a view of the 3D model;
receive a specification of a part in the 3D model; and
receive a definition of a reference to a region of the part in the 3D model.

* * * * *